United States Patent
Hwang et al.

(10) Patent No.: US 8,044,426 B2
(45) Date of Patent: Oct. 25, 2011

(54) LIGHT EMITTING DEVICE CAPABLE OF REMOVING HEIGHT DIFFERENCE BETWEEN CONTACT REGION AND PIXEL REGION AND METHOD FOR FABRICATING THE SAME

(75) Inventors: Kwang Jo Hwang, Gyeonggi-do (KR); Hee Dong Choi, Chungcheongnam-do (KR); Jae Hee Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 184 days.

(21) Appl. No.: 11/588,002

(22) Filed: Oct. 26, 2006

(65) Prior Publication Data

US 2007/0267648 A1   Nov. 22, 2007

(30) Foreign Application Priority Data

May 17, 2006  (KR) ................. 10-2006-0044361

(51) Int. Cl.
*H01L 33/00* (2010.01)
(52) U.S. Cl. .............. 257/99; 257/72; 257/E33.062; 257/E33.065
(58) Field of Classification Search .............. 257/72, 257/99, E33.062, E33.065; 438/151, 158, 438/455, 456; 313/499, 500, 505, 509
See application file for complete search history.

(56) References Cited

U.S. PATENT DOCUMENTS

| 7,038,377 B2 | 5/2006 | Kobayashi et al. | |
|---|---|---|---|
| 2002/0088984 A1* | 7/2002 | Toda et al. | 257/99 |
| 2003/0168966 A1* | 9/2003 | Kobayashi et al. | 313/495 |
| 2005/0087742 A1* | 4/2005 | Chang et al. | 257/72 |
| 2005/0095761 A1* | 5/2005 | Tanaka | 438/166 |
| 2005/0145861 A1* | 7/2005 | Kawakami et al. | 257/88 |
| 2005/0184652 A1 | 8/2005 | Maruyama et al. | |
| 2006/0082284 A1 | 4/2006 | Shibusawa | |

FOREIGN PATENT DOCUMENTS

| CN | 1674734 A | 9/2005 |
|---|---|---|
| DE | 10361008 A1 | 10/2004 |
| DE | 10360886 A1 | 9/2005 |
| TW | 2003-02674 | 8/2003 |

OTHER PUBLICATIONS

Office Action issued in corresponding Taiwanese Patent Application No. 095141799; issued Dec. 29, 2009.
Office Action issued in corresponding German Patent Application No. 10 2006 047 433.3; issued Apr. 7, 2010.

* cited by examiner

*Primary Examiner* — Lex Malsawma
*Assistant Examiner* — Robert Huber
(74) *Attorney, Agent, or Firm* — Brinks Hofer Gilson & Lione

(57) ABSTRACT

A light emitting device includes a first substrate and a second substrate. Each substrate may be subdivided into a contact region and a pixel region. Conductive elements positioned in each of the contact region and pixel region of the first substrate may be of substantially the same height.

13 Claims, 6 Drawing Sheets

LIGHT EMITTING DEVICE CAPABLE OF REMOVING HEIGHT DIFFERENCE BETWEEN CONTACT REGION AND PIXEL REGION AND METHOD FOR FABRICATING THE SAME

PRIORITY CLAIM

This application claims priority to and the benefit of Korea Patent Application No. 10-2006-0044361, filed on May 17, 2006, the entire content of which is incorporated herein by reference.

BACKGROUND

1. Technical Field

The present disclosure relates to a light emitting device and a method for fabricating the same.

2. Related Art

A light emitting device, which may be used in various flat panel displays, uses light which is emitted by electron-hole recombination. The light emitting device has advantages compared to other flat panel displays in that its response time is relatively fast and its power consumption is relatively low. Also, because the light emitting device does not require a backlight unit a light emitting device and/or devices using a light emitting device may be light weight.

An organic light emitting device (OLED) comprises an electron injection electrode, a hole injection electrode, and an emitting layer. The emitting layer may be made from an organic compound formed between the electron injection electrode and the hole injection electrode. When an injecting electron charges into the emitting layer, the injected electron and the injected hole are paired together. The extinction of the injected hole-electron pair results in electroluminescence.

Generally, in manufacturing an OLED, thin film transistors (TFT) are first formed on a substrate, and then organic light emitting diodes connected to the thin film transistors are formed on the thin film transistor. Subsequently, the substrate comprising the TFTs and the organic light emitting diodes is sealed with a sealing substrate.

In some situations, although the thin film transistors may be properly formed, the OLED may be defective if the light emitting diodes are formed with defects. In other words, the yield of the OLED depends on the yield of the emitting diodes. This increases expenses and processing time in manufacturing the OLED.

FIG. 1 is a cross-sectional view of a light emitting device of a related art. In FIG. 1, a buffered layer 105 is disposed on a first substrate 100 which may include a contact region A and a pixel region B. Signal lines including a scan line (not shown), a first power line 110a, a gate electrode 110b, and a second power line 110c are disposed on the buffered layer 105.

A gate insulating layer 115 is disposed on the first substrate comprising signal lines. The gate insulating layer 115 comprises a first via-hole and a second via-hole, 135a and 135d, which expose portions of the first power line 110a and the second power line 110c.

A semiconductor layer 120 is disposed on the gate insulating layer 115 in pixel region B. At least a portion of the semiconductor corresponds to the gate electrode 110b. A drain electrode 125b and a source electrode 125c are disposed on portions of the semiconductor layer 120.

A contact layer 125a is disposed on the gate insulating layer 115 of the contact region A. The contact layer 125a connects to the first power line 10a through the first via-hole 135a. The contact layer 125a comprises the same material of the drain electrode 125b and the source electrode 125c.

A passivation layer 130 is disposed on the substrate comprising the contact layer 125a, the drain electrode and the source electrode 125b and 125c. The passivation layer 130 is formed to expose the contact layer 125a and the second via-hole 135d. A third and a fourth via-hole, 135b and 135c, are disposed in the passivation layer 130 exposing portions of the drain electrode 125b and the source electrode 125c.

The first metal line 140 is disposed on the source electrode 125c and electrically connects the source electrode 125c to the second power line 110c through the fourth via-hole 135c and the second via-hole 135d.

A first electrode 155 is disposed on the second substrate 150 opposing the first substrate 100. The first electrode 155 may be an anode. A pixel defining layer 160 is disposed on the first electrode 155. The pixel defining layer 160 comprises a first contact hole 165a on the contact region A and an opening 165b on the pixel region B exposing the first electrode 155.

A first spacer and a second spacer 175a and 175b are disposed on the contact region A and the pixel region B of the pixel defining layer 160, respectively. A second metal line 180a is disposed on the first spacer 175a connected to the first electrode 155 through the first contact hole 165a and a second electrode 180b is disposed on the second spacer 175b and emitting layer 170. The second electrode 180b may be a cathode.

The first substrate 100 is bonded with the second substrate 150 using a sealant 190. The second metal line 180a is electrically connected to the contact layer 125a and the second electrode 180b is electrically connected to the drain electrode 125b disposed on the first substrate 100.

As described above, the light emitting device is prepared as the first substrate 100 is bonded with the second substrate 150 after manufacturing them respectively. So, the first power line and the drain electrode disposed on the first substrate 100 are respectively connected to the first electrode and the second electrode using the spacers 175a and 175b.

There is a height difference between the contact region A and the pixel region B of the first substrate 100. As shown at C, in FIG. 1, it does not allow connecting the contact layer 125a of the first substrate 100 to the second metal line 180a of the second substrate 150. Therefore, a driving voltage from the first power line can not be supplied to the first electrode. This disadvantageously affects the quality of images and it may deteriorate the reliability and decrease yield of the light emitting device.

SUMMARY

A light emitting device includes a first substrate and a second substrate. Each substrate may be subdivided into a contact region and a pixel region. Conductive elements positioned in each of the contact region and pixel region of the first substrate may be of substantially the same height.

A method of fabricating a light emitting device includes preparing a first substrate having a contact region and a pixel region. Signal lines which may include a gate electrode, a scan line, a first power line, and a second power line are formed on the first substrate and may be used to define the contact region and the pixel region. A gate insulating layer is formed over the gate electrode and other signal lines. A first contact layer and a semiconductor layer are formed on the contact region and the pixel region of the gate insulating layer, respectively. A second contact layer is formed on some or all of the first contact layer while a source electrode and a drain electrode is formed on the semiconductor layer. Multiple via-holes are formed in the gate insulating layer to enable metal lines to electrically connect the first power line and the second contact layer, and to connect the source electrode and the second power line

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF AN EMBODIMENTS

Figure 1:
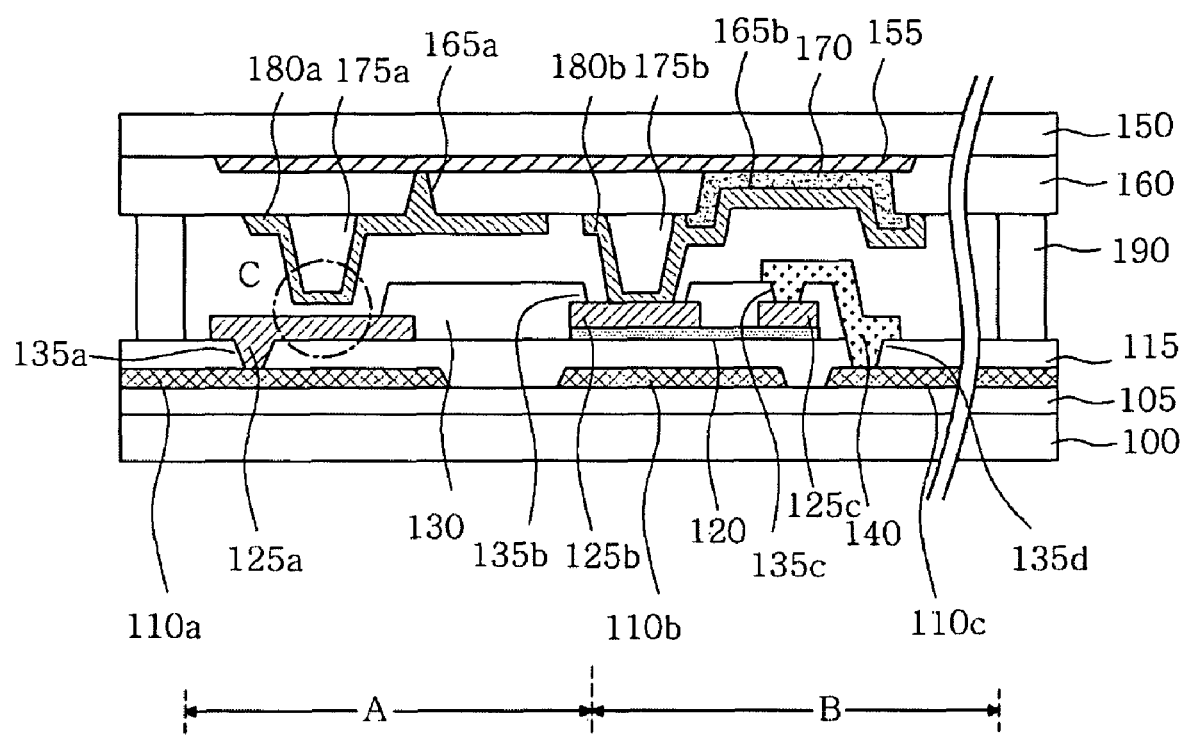
FIG. 1 is a cross-sectional view of a light emitting device according to a related art.

In the drawings, if it is mentioned that a layer is positioned on a different layer or a substrate, the layer may be formed directly on the different layer or the substrate, or another layer may be interposed there between.

Figure 2:
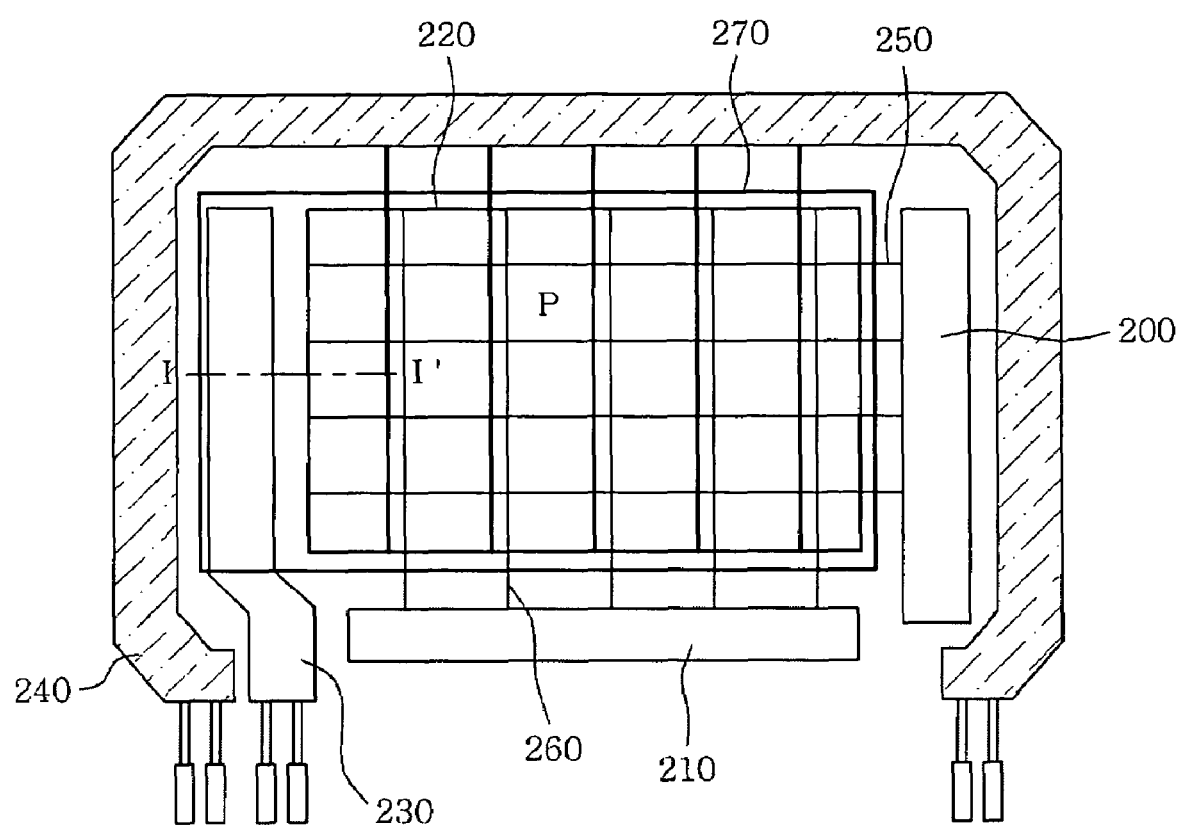
FIG. 2 is a plan view of a light emitting device according to an embodiment of the present invention.

FIG. 2 is a plan view of a light emitting device. In FIG. 2, the light emitting device includes a scan driver 200, a data driver 210, a controller (not shown), a power source (not shown), and a display panel 220.

The controller generates control signals. The control signals are supplied to the scan driver 200, the data driver 210, and the power source. The scan driver 200 supplies scan signals to the scan lines 250 of the display panel 220 according to the control signals. The data driver 210 supplies data signals to data lines 260 of the display panel 220. The scan signals and the data signals may be synchronized by the controller. The power source supplies the voltages to the first and the second power lines 230 and 240 of the display panel 220 according to control signals from the controller.

The display panel 220 includes a plurality of pixels P. Each pixel may be in a pixel region that is defined by the intersection of the data lines 260 and the scan lines 250. A pixel P may include at least a thin film transistor (not shown) and an emitting diode. The emitting diode includes a first electrode 270, an emitting layer (not shown), and a second electrode (not shown). The first electrode 270 may be formed as a common electrode disposed on the whole the display panel. The first electrode 270 may be electrically connected to the first power line 230. The second electrode likewise is connected to the thin film transistors and the second power line 240.

Figure 3:
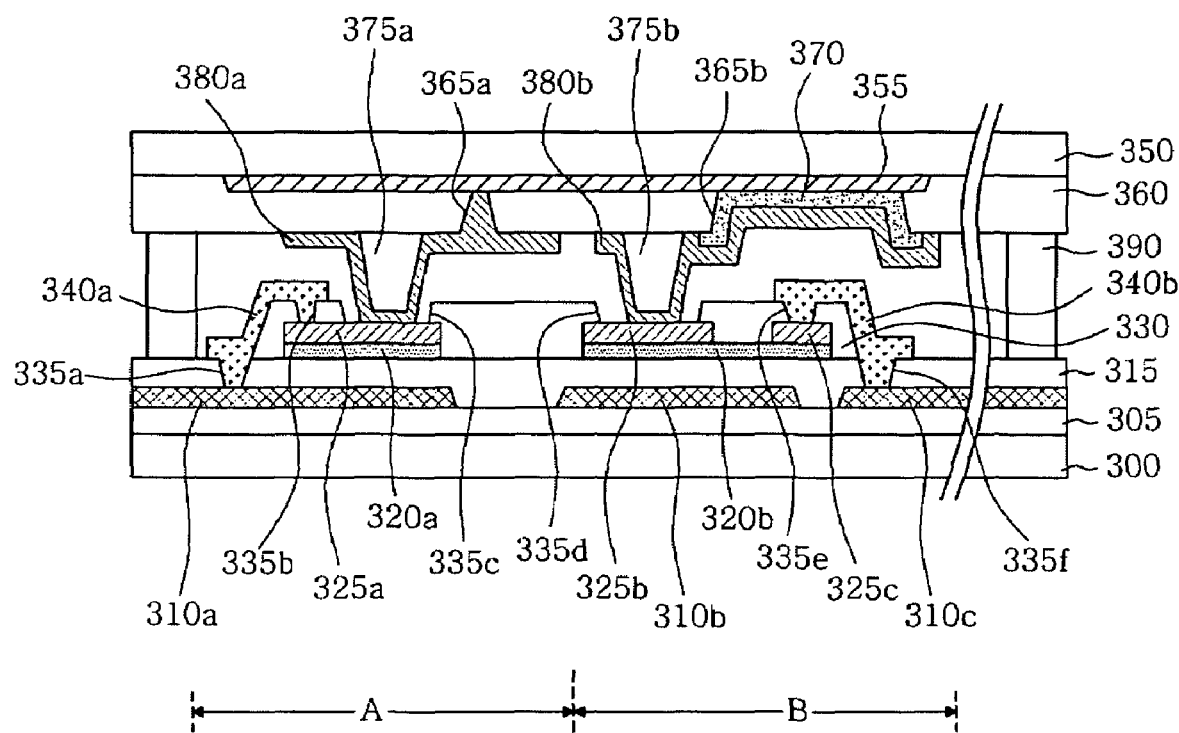
FIG. 3 is a cross-sectional view of a light emitting device according to an embodiment of the present invention, taken along the line I-I' in FIG. 2.

FIG. 3 is a cross-sectional view of a light emitting device taken along the line I-I' in FIG. 2. In FIG. 3, a buffered layer 305 is disposed on a first substrate 300. Signal lines which may include a scan line (not shown), a first power line 310a, a gate electrode 310b, and a second power line 310c are disposed on the buffered layer 305. The first power line 310a may be a positive power line VDD, and the second power line 310c may be a negative power line VSS. A pixel region B may be defined by the intersection of the some of the signal lines, and a contact region A may be defined by the position of the first power line 310a.

A gate insulating layer 315 is disposed on the first substrate 300 comprising the signal lines. A first contact layer 320a may be disposed on the gate insulating layer 315 in contact region A, and a second contact layer 325a is disposed on the first contact layer 320a. A semiconductor layer 320b may be disposed on the gate insulating layer 315 in pixel region B. A semiconductor layer 320b is placed in relationship with the gate electrode 310b. A drain electrode 325b and a source electrode 325c may be disposed on portions of the semiconductor layer 320b. In some instances, the first contact layer 320a and the semiconductor layer 320b are formed of the same material and are of substantially the same height. Similarly, in some instances, the second contact layer 325a is formed of the same material as the drain electrode 325b and the source electrode 325c. Additionally, the height of the second contact layer 325a, the drain electrode 325b, and the source electrode 325c may be substantially equal.

A passivation layer 330 is disposed on the first substrate 300 comprising the second contact layer 325a, the drain electrode 325b, the source electrode 325c, and the gate insulating layer 315. A first via-hole 335a exposes a portion of the first power line 310a through the gate insulating layer 315 and the passivation layer 330. A second via-hole 335f exposes a portion of the second power line 310c through the gate insulating layer 315 and the passivation layer 330. A third via-hole 335b and a fourth via-hole 335c expose portions of the second contact layer 325a through the passivation layer 330. A fifth and a sixth via-hole 335d and 335e expose a portion of the drain electrode 325b and the source electrode 325c through the passivation layer, respectively.

The first metal line 340a electrically connects the first power line 310a to the second contact layer 325a through the first via-hole 335a and the third via-hole 335b. The second metal line 340b electrically connects the source electrode 325c and the second power line 310c through the sixth via-hole 335e and the second via-hole 335f.

Next, a second substrate 350 opposing the first substrate 300 is prepared. A first electrode 355 is disposed on a second substrate 350. The first electrode 355 may be an anode. A pixel defining layer 360 is disposed on the first electrode 355. A first contact hole 365a and an opening 365b are disposed in the pixel defining layer 360 exposing portions of the first electrode 355. The first contact hole 365a is disposed on the contact region A, and the opening 365b is disposed on the pixel region B. An emitting layer 370 is disposed in the opening 365b.

A first spacer 375a is disposed on the contact region A of the pixel defining layer 360, and a second spacer 375b is disposed on the pixel region B of the pixel defining layer 360. A third metal line 380a is disposed on the first spacer 375a, and electrically connects to the first electrode 355 through the first contact hole 365a. A second electrode 380b is disposed on the second spacer 375b and emitting layer 370.

The first substrate 300 may be bonded with the second substrate 350 using a sealant 390. When the first substrate 300 and the second substrate 350 are placed together, the third metal line 380a and the second electrode 380b are electrically connected to the second contact layer 325a and drain electrode 325b. The electrical connections may be made through the fourth via-hole 335c and the fifth via-hole 335d, respectively.

Figure 4A:
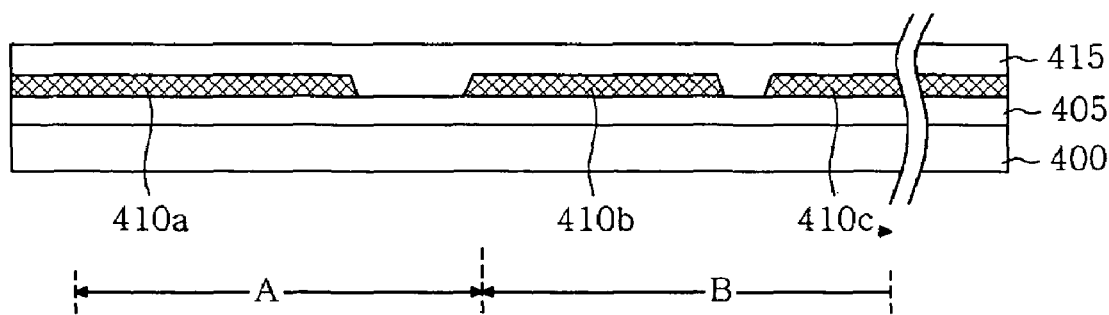
FIG. 4A shows a gate insulating layer formed on a buffered layer and a first substrate.

FIG. 4A to FIG. 4H are cross-sectional views which illustrate the fabrication of a light emitting device. In FIG. 4A, a buffered layer 405 is selectively formed on a first substrate 400. The first substrate 400 may be formed of a material such as glass. The buffered layer 405 provides protection for a TFT from impurities such as alkali ions diffused from the first substrate 400. The buffered layer 405 may be composed of silicon oxide, SiO2, or silicon nitride, SiNx.

A first conductive layer is deposited on the combination of the first substrate 400 and the buffered layer 405. The first conductive layer may be Al, Al alloy, Mo, Mo alloy, W, WSi2, and/or the like. Signal lines which include a scan line, a first power line 410a, a gate electrode 410b, and a second power line 410c are formed by patterning the first conductive layer. The first power line 410a may be a positive power line VDD that conducts a positive voltage. The second power line 410c may be negative power line VSS that conducts a negative voltage. The light emitting device of FIG. 4A to FIG. 4H may be divided into different regions. A pixel region B may be defined by the intersection of the signal lines. A contact region A may be defined according to the position of the first power line 410a. A gate insulating layer 415 may be formed on the first substrate 400 comprising the signal lines. The gate insulating layer 415 may be formed of silicon oxide, silicon nitride, and/or other insulating materials. The gate insulating layer 415 may include a single insulating layer or may be made from a combination of different insulating materials.

Figure 4B:
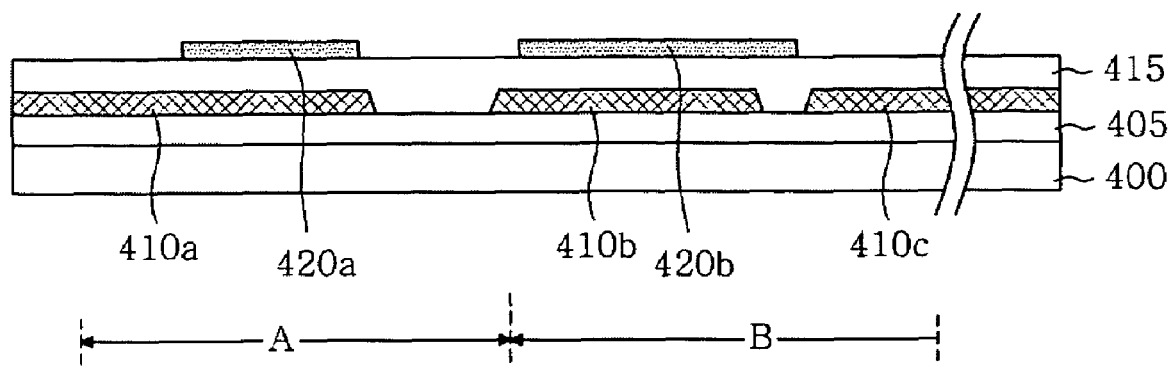
FIG. 4B shows the addition of a first contact layer and a semiconductor layer on the first substrate.

In FIG. 4B, an amorphous silicon layer or a poly silicon layer is formed on the gate insulating layer 415. A first contact layer 420a is formed in the contact region A by pattering the amorphous layer. A semiconductor layer 420b is formed on the gate insulating layer 415 in the pixel region B by patterning the amorphous layer. The semiconductor layer 420b is placed in relationship with the gate electrode 410b. The first contact layer 420a is of substantially the same height as that of the semiconductor layer 420b.

A second conductive layer is deposited on the first substrate 400 comprising the first contact layer 420a and the semiconductor layer 420b. The second conductive layer may be a material having low resistance. In some instances, the second conductive layer may be formed of MoW, Ti, Al, Al alloy and/or the like.

Figure 4C:
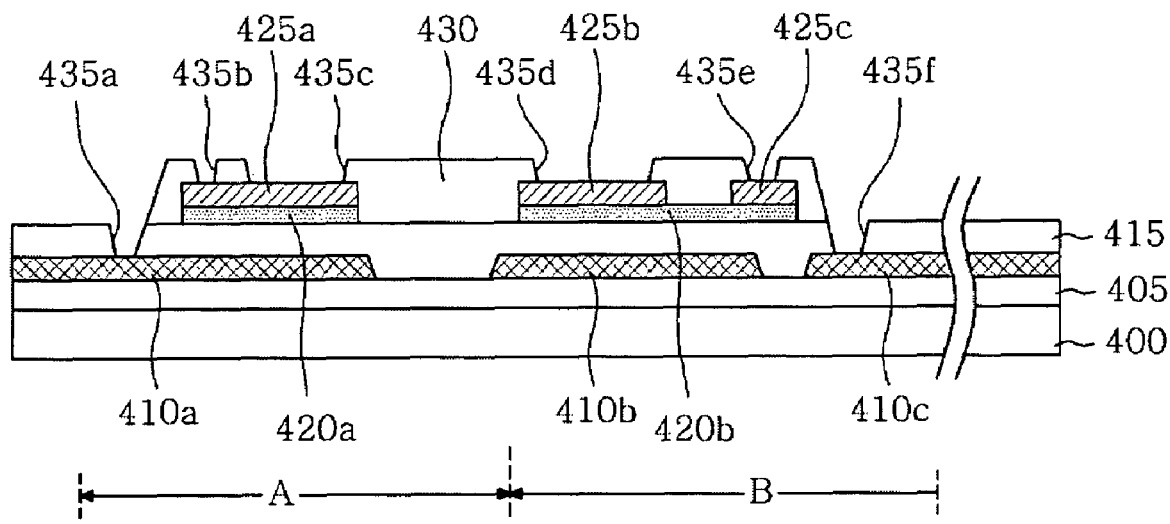
FIG. 4C shows the addition of a second contact layer and a passivation layer.

By patterning the second conductive layer, a second contact layer 425a is formed on the first contact layer 420a, as shown in FIG. 4C. A similar patterning process may be used to form a drain electrode 425b and a source electrode 425c on portions of the semiconductor layer 420b. The second contact layer 425a may be of substantially the same height as that of the drain electrode 425b and/or the source electrode 425c. Additionally, the combined height of the first and second contact layers 420a and 425a may be of substantially the same height as that of the combined height of the semiconductor layer 420b and the drain electrode 425b.

A passivation layer 430 is formed on the first substrate 400 comprising the second contact layer 425a, the drain electrode 425b, the source electrode 425c, and the gate insulating layer 415. In some implementations, openings or via-holes are formed or created in the passivation layer 430 and/or the gate insulating layer 415. As shown in FIG. 4C, the passivation layer 430 has been etched to form via-holes 435b and 435c, and contact holes 435d and 435e. A first via-hole 435a and a second via-hole 435f may be formed in the gate insulating layer 415 by etching away portions of the gate insulating layer 415. At the same time, a third and a fourth via-hole 435b and 435c exposing portions of the second contact layer 425a may be formed in the passivation layer 430. Similarly, a fifth and a sixth contact hole 435d and 435e exposing respectively the drain electrode 425b and the source electrode 425c may be formed in the passivation layer 430 by etching portions of the passivation layer 430. The via-holes are formed at substantially the same time by dry etching or the via-holes may be formed at different times.

Figure 4D:
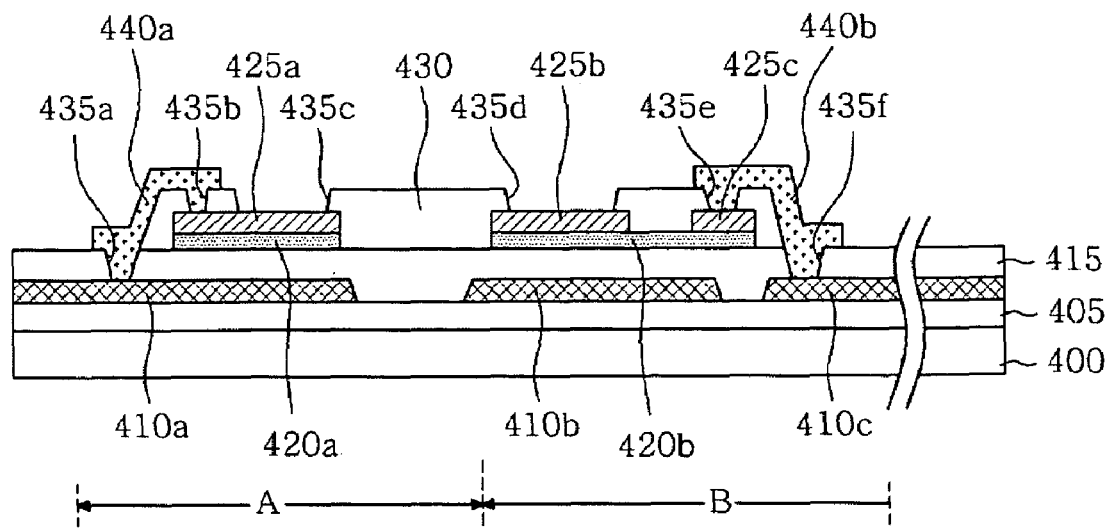
FIG. 4D shows the addition of a first and second metal line.

In FIG. 4D, a third conductive layer is added to the light emitting device subunit. The third conductive layer includes a first metal line 440a and a second metal line 440b. The first metal line 440a electrically connects the first power line 410a and the second contact layer 425a through the first via-hole 435a and the third via-hole 435b. The second metal line 440b electrically connects the source electrode 425c and the second power line 410c through the sixth via-hole 435e and the second via-hole 435f.

Figure 4E:
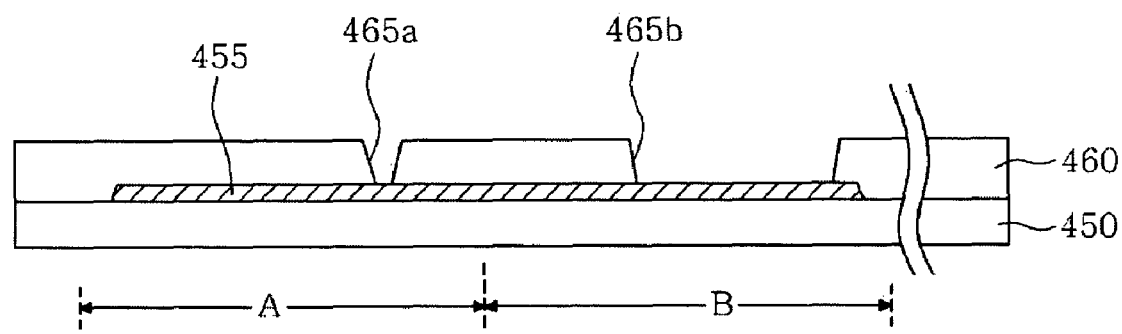
FIG. 4E shows a second substrate with a first electrode and a pixel defining layer.

In FIG. 4E, a second substrate 450 including a contact region A and a pixel region B is prepared. A fourth conductive layer forms a first electrode 455 on the second substrate 450. The first electrode 455 may be an anode which includes ITO (Indium Tin Oxide), IZO (Indium Zinc Oxide), ICO (Indium Cerium Oxide), ZnO (Zinc Oxide) and/or the like. The first electrode 455 may be transparent and may have a high work function. The first electrode 455 is formed as a common electrode which is not patterned corresponding to respective pixels, as shown as 270 in FIG. 2.

A pixel defining layer 460 is formed on the first electrode 455 of the second substrate 450. A first contact hole 465a and an opening 465b are formed in the pixel defining layer 460 and expose one or more portions of the first electrode 455. The first contact hole 465a and the opening 465b may be formed by patterning the pixel defining layer 460. The first contact hole 465a is disposed in the contact region A, while the opening 465b is disposed in the pixel region B.

Figure 4F:
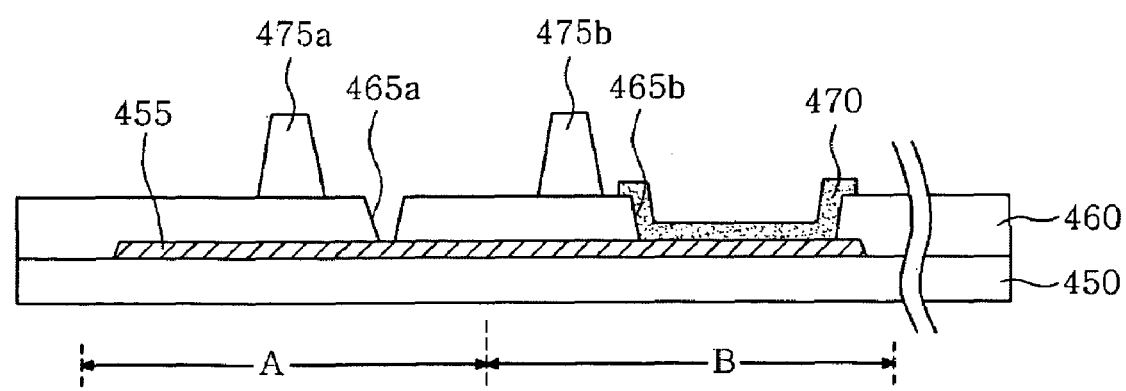
FIG. 4F shows the formation of spacers.

FIG. 4F shows the formation of spaces and an emitting layer. In FIG. 4F, a photo-resist is coated on the pixel defining layer 460 and then the photo-resist is patterned with a photolithography process to form a first spacer 475a and a second spacer 475b. The first spacer 475a and the second spacer 475b may be formed on the position that corresponds to the second contact layer 425a and the drain electrode 425b of the first substrate 400. In some fabrication methods the first spacer 475a and the second spacer 475b are formed using materials other than photo-resist materials.

An emitting layer 470 is formed in the opening 465b. Although it is not shown, a hole injection layer and/or a hole transfer layer may be formed between the first electrode 455 and the emitting layer 470. Additionally, an electron transfer layer and/or an electron injection layer may be formed on the emitting layer 470.

Figure 4G:
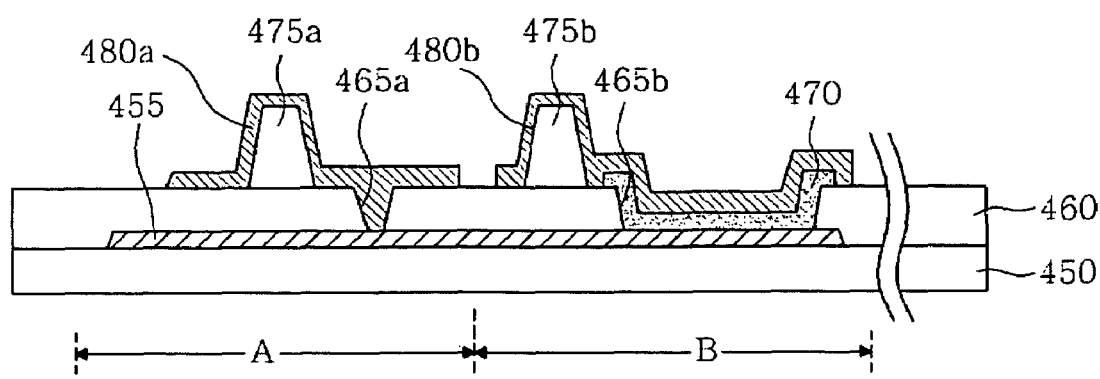
FIG. 4G shows the formation of a fifth conductive layer.

FIG. 4G shows the formation of a fifth conductive layer. In FIG. 4G, a fifth conductive layer is formed on the second substrate comprising the first spacer and the second spacer 475a and 475b, the first contact hole 465a and the emitting layer 470. The fifth conductive layer may include conductive materials such as Mg, Ag, Al, Ca, and/or or their alloys. The conductive materials of the fifth conductive layer may have a low resistance and low work function. In FIG. 4G, a third metal line 480a and a second electrode 480b may be formed by patterning the fifth conductive layer. The third metal line 480a is formed on the first spacer 475a and electrically connects to the first electrode 455 through the first contact hole 465a. The second electrode 480b is formed on the second spacer 475b and emitting layer 470

Figure 4H:
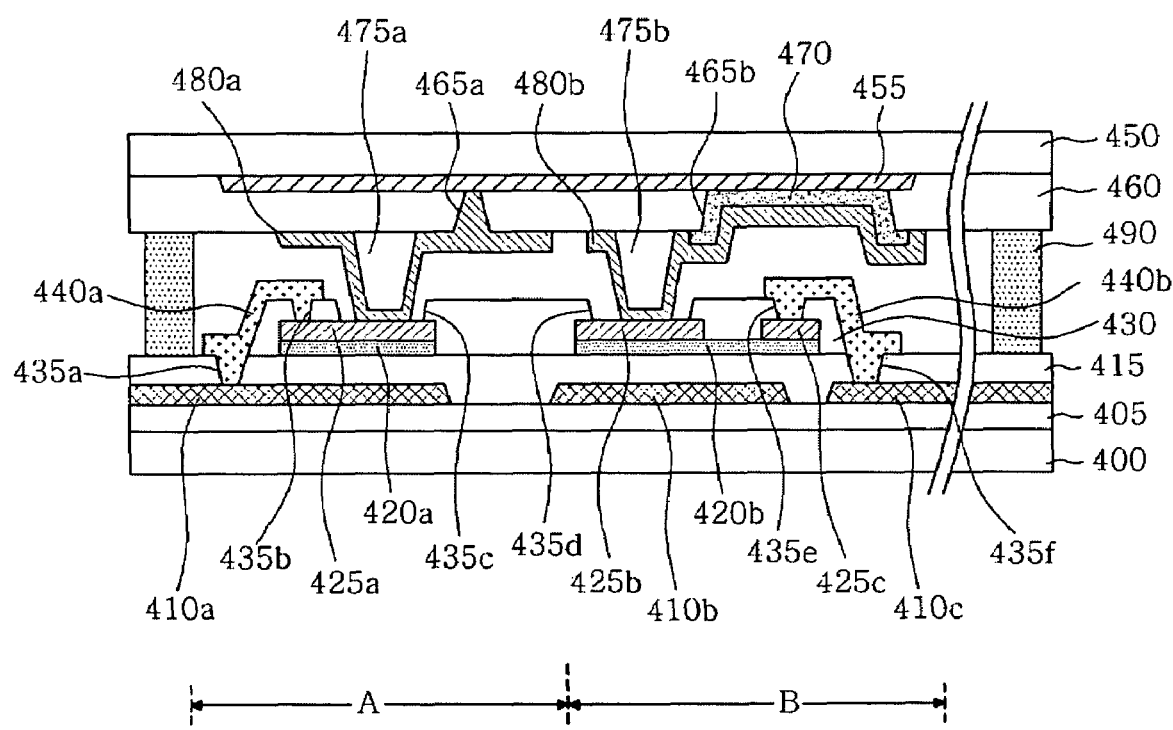
FIG. 4H shows the bonding of the first substrate with the second substrate.

FIG. 4H shows the attaching of a first substrate 400 to a second substrate 450. A sealant 490 may be used to attach the first substrate 400 and its associated layers/lines to the second substrate 450 and its associated layers/lines. By the attaching substrates together, the third metal line 480a and the second electrode 480b are respectively connected to the second contact layer 425a and the drain electrode 425b.

As described above, a light emitting device is formed where there is substantially no height difference between the first and second contact layers in the contact region A mounted to the first substrate and the semiconductor layer and drain electrode in the pixel region B mounted to the first substrate. Therefore, the first power line is connected to the first electrode when the first substrate is bonded with the second substrate. Accordingly, the first electrode may be supplied a driving voltage from the first power line. This may improve the quality of images and the yield and the reliability of the light emitting device.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

We claim:

1. A light emitting device comprising:
   a first substrate comprising a contact region and a pixel region;
   signal lines which are arranged on the first substrate to define the contact region and the pixel region, the signal lines comprising a plurality of scan lines, a first power line, and a second power line;
   a gate insulating layer which is disposed on the signal lines, the gate insulating layer comprising a first via-hole exposing a portion of the first power line, and a second via-hole exposing a portion of the second power line;
   a first contact layer disposed on the contact region of the gate insulating layer;
   a semiconductor layer disposed on the pixel region of the gate insulating layer;
   a second contact layer disposed on the first contact layer;
   a source electrode and a drain electrode disposed on portions of the semiconductor layer;
   a first metal line directly connecting a surface of the second contact layer with the first power line through the first via-hole; and
   a second metal line connecting the source electrode with the second power line through the second via-hole,
   wherein a combined thickness of the first contact layer and the second contact layer is substantially the same as a combined thickness of the semiconductor layer and the source electrode or the drain electrode, and
   wherein the surface of the second contact layer that directly connects the first metal line is separate from the first contact layer.

2. The light emitting device of claim 1, further comprising:
   a second substrate opposing the first substrate;
   a first electrode disposed on the second substrate;
   a pixel defining layer which is disposed on the first electrode, the pixel defining layer comprising a contact hole and an opening exposing portions of the first electrode;
   a first spacer disposed on the pixel defining layer corresponding to the contact region;
   a second spacer disposed on the pixel defining layer corresponding to the pixel region;
   an emitting layer disposed in the opening;
   a third metal line disposed on the first spacer; and
   a second electrode disposed on the second spacer and the emitting layer.

3. The light emitting device of claim 2, wherein the third metal line is coupled between the first electrode disposed on the second substrate and the second contact layer of the first substrate, and
   wherein the second electrode is electrically connected to the drain electrode of the first substrate when the first substrate is bonded with the second substrate.

4. The light emitting device of claim 1, wherein the thickness of the first contact layer is substantially the same as the thickness of the semiconductor layer.

5. The light emitting device of claim 1, wherein the thickness of the second contact layer is substantially the same as the thickness of the source electrode or the drain electrode, and an entire lower surface of the second contact layer is in contact with the first contact layer.

6. The light emitting device of claim 2, wherein the first electrode is an anode, and the second electrode is a cathode.

7. The light emitting device of claim 2, wherein the emitting layer comprises an organic material.

8. The light emitting device of claim 1, wherein the first power line is a positive power line, and the second power line is a negative power line.

9. The light emitting device of claim 1, further comprising an passivation layer which is disposed on the second contact layer, the source electrode and the drain electrode, wherein the passivation layer comprises a third via-hole and a fourth via-hole that expose portions of the second contact layer, and a fifth via-hole and a sixth via-hole that expose portions of the drain electrode and the source electrode.

10. A light emitting device, comprising:
    a first power line positioned in a contact region of a first substrate having the contact region and a pixel region;
    an insulating layer disposed on the first power line and having a first via hole;
    a semiconductor layer positioned on the insulating layer, the semiconductor layer positioned in the pixel region;
    a drain electrode positioned on the semiconductor layer; and
    a source electrode positioned on the semiconductor layer, the source electrode spaced apart from the drain electrode;
    a first contact layer disposed on the insulating layer; and
    a second contact layer disposed on the first contact layer and a surface of the second contact layer directly connected with the first power line by a first metal line,
    wherein a combined thickness of the first contact layer and the second contact layer is substantially the same as a combined thickness of the semiconductor layer and the source electrode or the drain electrode, and
    wherein the surface of the second contact layer that directly connects the first metal line is separate from the first contact layer.

11. The light emitting device of claim 10, further comprising:
    a gate electrode positioned in the pixel region of the first substrate, the insulating layer disposed on the gate electrode; and
    a second power line positioned in the pixel region, the second power positioned on the first substrate and spaced apart from the gate electrode.

12. The light emitting device of claim 10, wherein the first contact layer is substantially the same thickness as the semiconductor layer.

13. The light emitting device of claim 10, wherein the source electrode or the drain electrode are substantially the same thickness as the second contact layer, and an entire lower surface of the second contact layer is in contact with the first contact layer.

* * * * *